(12) United States Patent
Eldridge (10) Patent No.: US 7,626,405 B2
(45) Date of Patent: Dec. 1, 2009

(54) SUSPENSION SYSTEM AND ADJUSTMENT MECHANISM FOR AN INTEGRATED CHIP AND METHOD

(76) Inventor: David Eldridge, 26150 Bucks Run, Corral de Tierra, CA (US) 93908

( * ) Notice: Subject to any disclaimer, the term of this patent is extended or adjusted under 35 U.S.C. 154(b) by 309 days.

(21) Appl. No.: 11/764,230

(22) Filed: Jun. 18, 2007

(65) Prior Publication Data
US 2008/0309359 A1    Dec. 18, 2008

(51) Int. Cl.
*G01R 31/02* (2006.01)
(52) U.S. Cl. .................................. 324/758; 324/755
(58) Field of Classification Search .................. None
See application file for complete search history.

(56) References Cited

U.S. PATENT DOCUMENTS 6,086,387 A * 7/2000 Gallagher et al. ............. 439/71
7,101,209 B2 * 9/2006 Yates et al. .................. 439/331

* cited by examiner

*Primary Examiner*—Minh N Tang
(74) *Attorney, Agent, or Firm*—Donald R. Boys; Central Coast Patent Agency Inc.

(57) ABSTRACT

Disclosed herein is a suspension system and adjustment mechanism for an integrated chip held in a clamping or similar assembly and a related method for same. The suspension system Includes a pressure plate member adapted to fit compatibly within the clamp assembly. A hinge assembly applies and releases pressure through the pressure plate member. The hinge assembly has a first open position where pressure is released and a second closed position where pressure is applied. A spring member between the pressure plate member and the hinge assembly has predetermined travel limits controlling the amount of pressure to be applied. In an exemplary embodiment of the invention disclosed herein the suspension system includes an adjustment mechanism which adjusts to the pressure to a fine degree. The adjustment mechanism includes a housing which applies and releases pressures in response to the turning of a control knob. The control knob is connected to a gear apparatus within the housing which responds to the movement of the control knob by moving the housing.

13 Claims, 6 Drawing Sheets

SUSPENSION SYSTEM AND ADJUSTMENT MECHANISM FOR AN INTEGRATED CHIP AND METHOD

RELATED APPLICATION

Filed concurrently with this application is an application entitled Integrated Chip Clamp Adjustment Assembly And Method having the same inventive entity. The entire specification of the Integrated Chip Clamp Adjustment Assembly And Method is specifically incorporated herein.

FIELD OF THE INVENTION

This invention generally relates to electronic equipment used to secure an integrated chip (IC) in a clamping assembly and adjust the pressure applied to the IC. Additionally, the invention relates to electronic equipment used for testing and more particularly to securing an IC in the clamping assembly and applying and releasing pressure so as to optimally engage the electronic contacts to secure the IC without causing damage to either the IC or the test equipment.

BACKGROUND OF THE INVENTION

In the process of testing and manufacturing integrated chips, the IC itself must be secured in a clamping assembly where it can be tested and analyzed. The IC must be first placed into a clamping assembly. The clamping assembly has suitable electronic contacts for testing and analyzing the IC. These contacts must match and be compatible with the IC to perform the functions desired. Additionally, in typical situations, pressure must be applied to the IC in order for the IC to engage the contacts.

Thus, in order to test or otherwise analyze the IC, the IC must be secured in a clamping assembly having electronic contacts. Since the contacts can be quite numerous, it is essential the location of the IC match with the contacts and further that once they match, that they remain matched for testing. The only way to accomplish this is to make the IC secured in the clamping assembly with the contacts and IC properly aligned.

Next, in order to test or otherwise analyze the IC, pressure must be applied to the IC to engage the electrical contacts and the IC. However, too much pressure will cause the damage to the IC and possibly the test equipment itself. Conversely, too little pressure will cause the contacts to fail to engage and testing and analysis will be useless.

Consequently, there is needed a device for securing the IC in the clamping assembly which optimally causes the IC to engage the contacts. Additionally, there is a need to provide such a device that allows fine adjustment of pressure to or release therefrom by the IC to the electrical contacts.

In accordance with the long felt need described above, the invention herein is described in detail below.

SUMMARY OF THE INVENTION

It is an object of this invention to provide a device for securing an IC in a clamping assembly to allow for testing and analysis.

It is an additional object of this invention to provide such a device which in addition to securing the IC in the clamping assembly also provides structure for applying pressure to the IC while in the clamping assembly to ensure proper contact between the IC and the electrical contacts of the clamping assembly.

In an exemplary embodiment of the device in accordance with this invention, comprises:

a suspension system for an integrated chip (IC) held in a clamp assembly, the suspension system comprising:

a pressure plate member, adapted to fit compatibly within the clamp for applying pressure to the IC;

a hinge assembly for applying and releasing pressure to the pressure plate member, the hinge assembly having a first open position and a second closed position where pressure is applied;

a spring member between the pressure plate member and the hinge assembly, the spring member and the spring member having predetermined travel limits; and means connecting the hinge assembly, pressure plate member and spring member for regulating the pressure between the hinge assembly in the second position, whereby, the hinge assembly applies pressure the pressure plate member in the second position and releases the pressure as it moves toward the first position and whereby the pressure applied to the IC is regulated preventing the IC from being over pressured and damaged.

In another exemplary embodiment of the device in accordance with this invention, the device includes an adjustment mechanism, which attaches to the suspension system. The adjustment mechanism includes a control member, which causes the suspension system pressure plate to apply or release pressure.

In a more specific embodiment, the adjustment mechanism, comprises a housing;

a rotational gear member;

a translation gear member engaging the rotational gear member;

a control member connected to the rotational member for moving the rotational gear member; and a connection member for interfacing with the suspension system, and for converting the movement of the control member into applying pressure to the suspension system.

In an additional embodiment, the adjustment mechanism includes a housing. Within the housing is a first rotational member intersecting with a second translational member. A control member rotates the rotational member, which, in turn, moves the translational. As a result of movement of the translational member, the housing once affixed to the suspension system, moves up and down. And, further when the suspension system combined with the adjustment mechanism is attached to the clamping assembly, it moves the suspension system to apply or release pressure as appropriate.

It is an advantage of this invention to provide a device which secures the IC in a clamping assembly without damaging the IC or the clamping assembly.

It is an additional advantage of the device in accordance with this invention to provide a device which not only secures the IC in a clamping assembly, but also provides structure for applying and releasing pressure to the IC, also without damaging the IC or the clamping assembly.

BRIEF DESCRIPTION OF THE DRAWING

For a further understanding of the objects and advantages of the present invention, reference should be had to the following detailed description, taken in conjunction with the accompanying drawing, in which like parts are given like reference numerals and wherein.

DETAILED DESCRIPTION OF THE INVENTION

Figure 2:
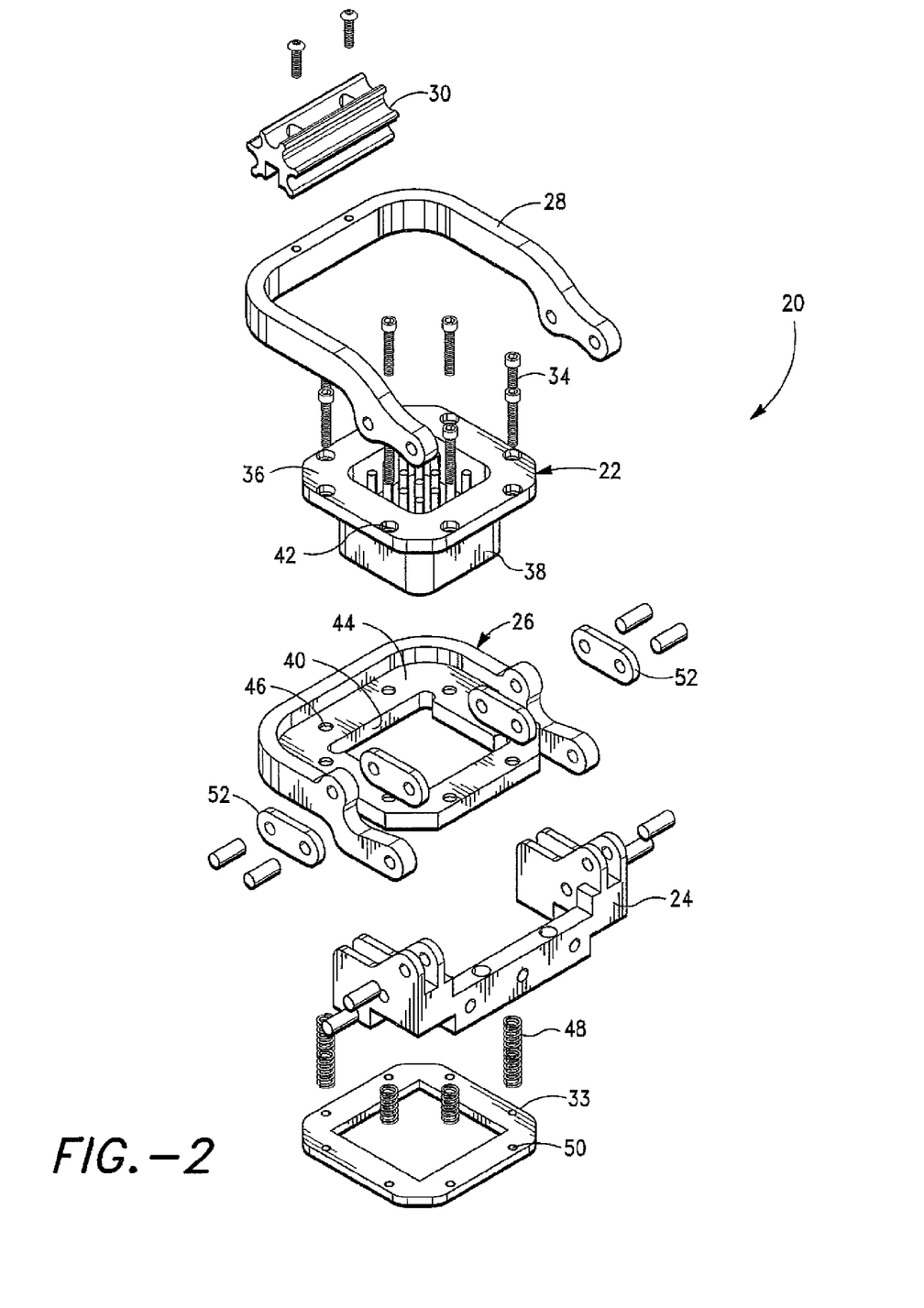
FIG. 2 is an exploded view of the suspension system in accordance with this invention.

An exemplary embodiment of the present invention will now be described with reference to the figures and in particular to FIG. 2, wherein there is shown one aspect of the invention, a suspension system for an integrated chip in a clamp assembly, generally indicated by the numeral 20.

The suspension system includes a pressure plate 22 and a hinge assembly. The hinge assembly includes a hinge member 24, a hinge frame 26, a handle member 28 and a grip 30. Additionally, the suspension system 20 includes a spring assembly comprising strut members 34 and springs 48 engaging an interface 33.

The pressure plate 22 has a flange 36 and a central portion 38. The central portion 38 applies pressure, as will be understood more fully hereinafter.

The hinge frame 26 has a central opening 40 which is configured for accepting the pressure plate central portion 38. The pressure plate 22 moves toward and away from an IC in response to movement of the hinge assembly.

The pressure plate flange 36 has a series of openings 42. Likewise, the hinge frame member 26 has an interior portion 44 having a compatible and aligned series of openings, 46. Additionally, the interface 33 has aligned openings 50.

Also in alignment with the openings 42 and 46 is the spring comprising a springs 48 and strut members 34, one for each opening 42 and 46. The strut members 34 are inserted through each of the openings 42 and 46 and the springs 48, and are secured to the interface 33 at the openings 50.

In operation, the pressure plate 22 responds to the movement of the hinge frame 26. For example, in the open position, illustrated in FIGS. 1 & 5, the pressure plate 22 applies no pressure to the IC. As the hinge frame 26 moves toward the second or closed position illustrated in FIGS. 3 and 4, the pressure plate 22 applies pressure to the IC in a clamp assembly 100. The amount of pressure that can be applied to the IC is limited by the travel of the spring assembly, comprising the springs 48 between the interface 33 and the hinge frame 26.

Figure 3:
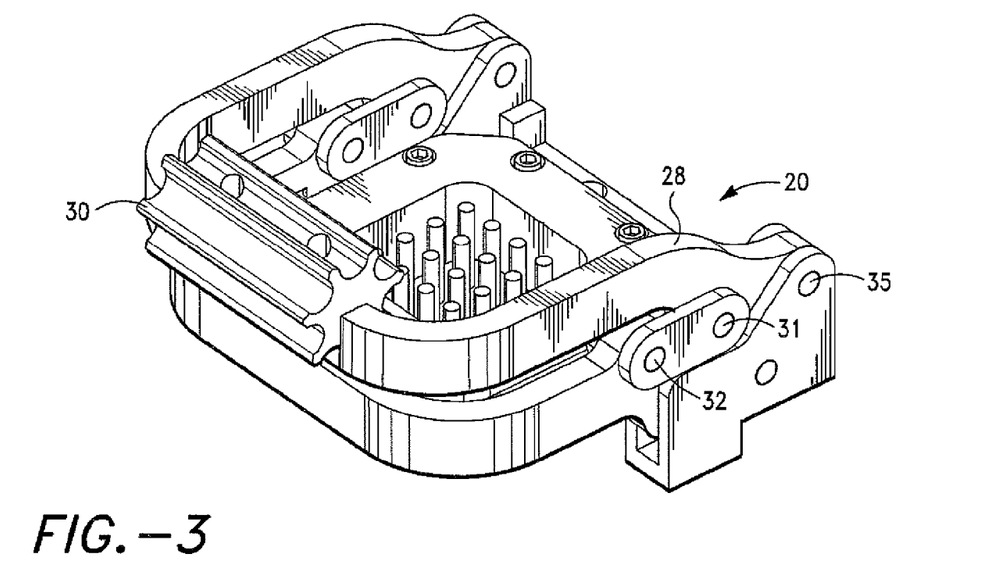
FIG. 3 is a top perspective view of the suspension system in accordance with this invention.
Figure 4:
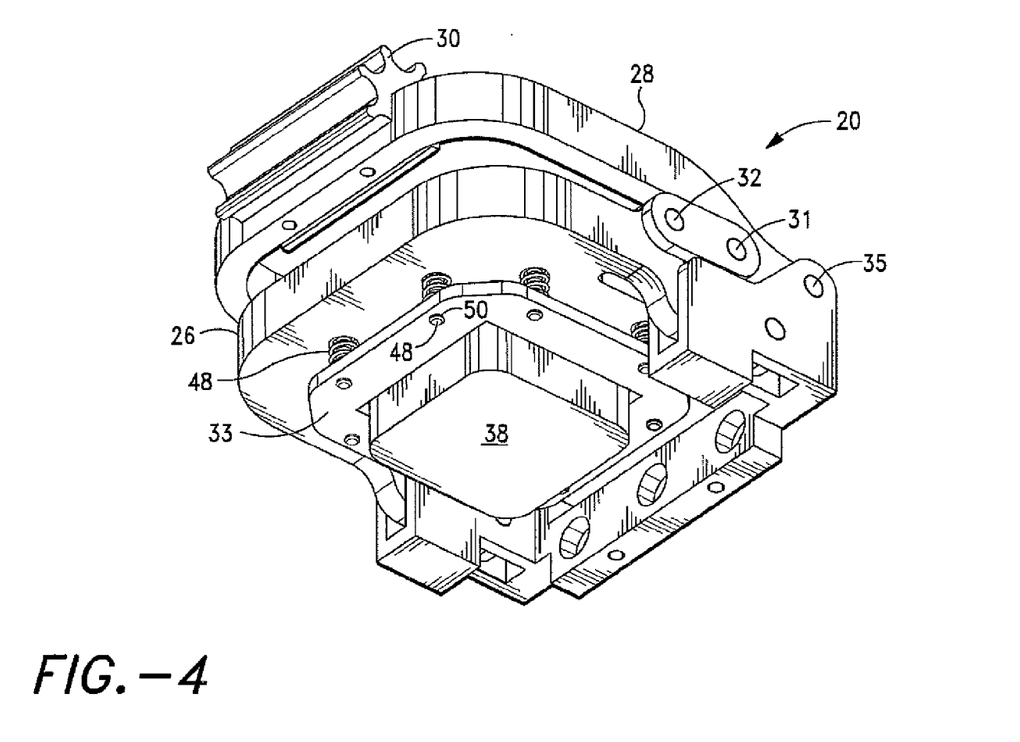
FIG. 4 is a bottom perspective view of the suspension system in accordance with this invention.
Figure 5:
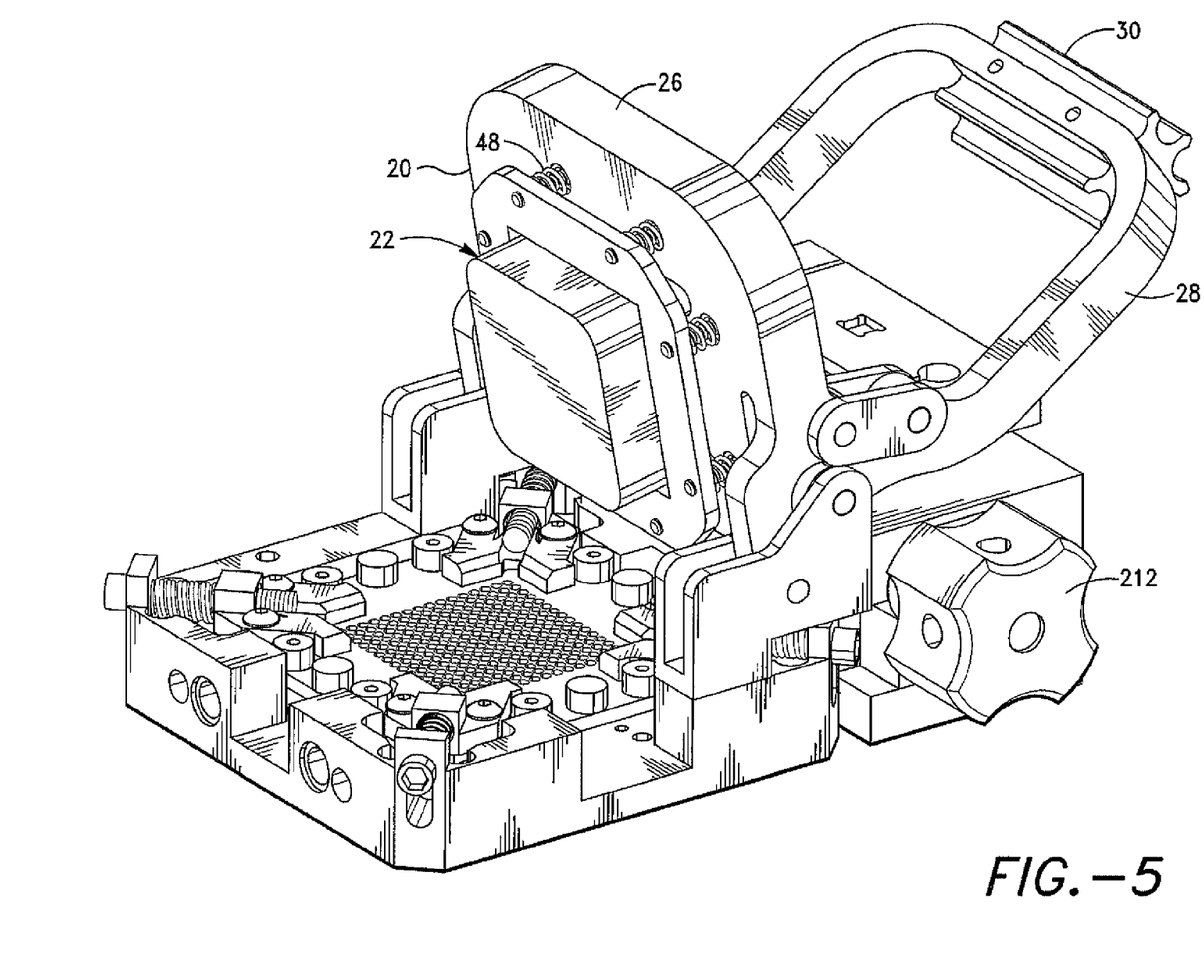
FIG. 5 is a perspective view of the suspension system in accordance with this invention in the open position with the adjustment mechanism.

In the closed position shown in FIGS. 3 & 4, the handle 28, using the grip 30, is used to open the hinge assembly 20 toward the open position shown in FIG. 5, thereby releasing the pressure on the IC. Conversely, in order to apply pressure to hold the IC in place the handle is moved in the opposite direction.

As is well understood in the art, applying too much pressure to the IC will cause damage. As is evident from the structure and description above, the pressure applied to the IC is regulated by the spring assembly and limited by the amount of travel of the springs 48. Additionally, the provide consistent pressure against the IC causing uniform contact between the pressure plate and IC and also uniform contact is provided between the IC and the clamp assembly 100.

Figure 1:
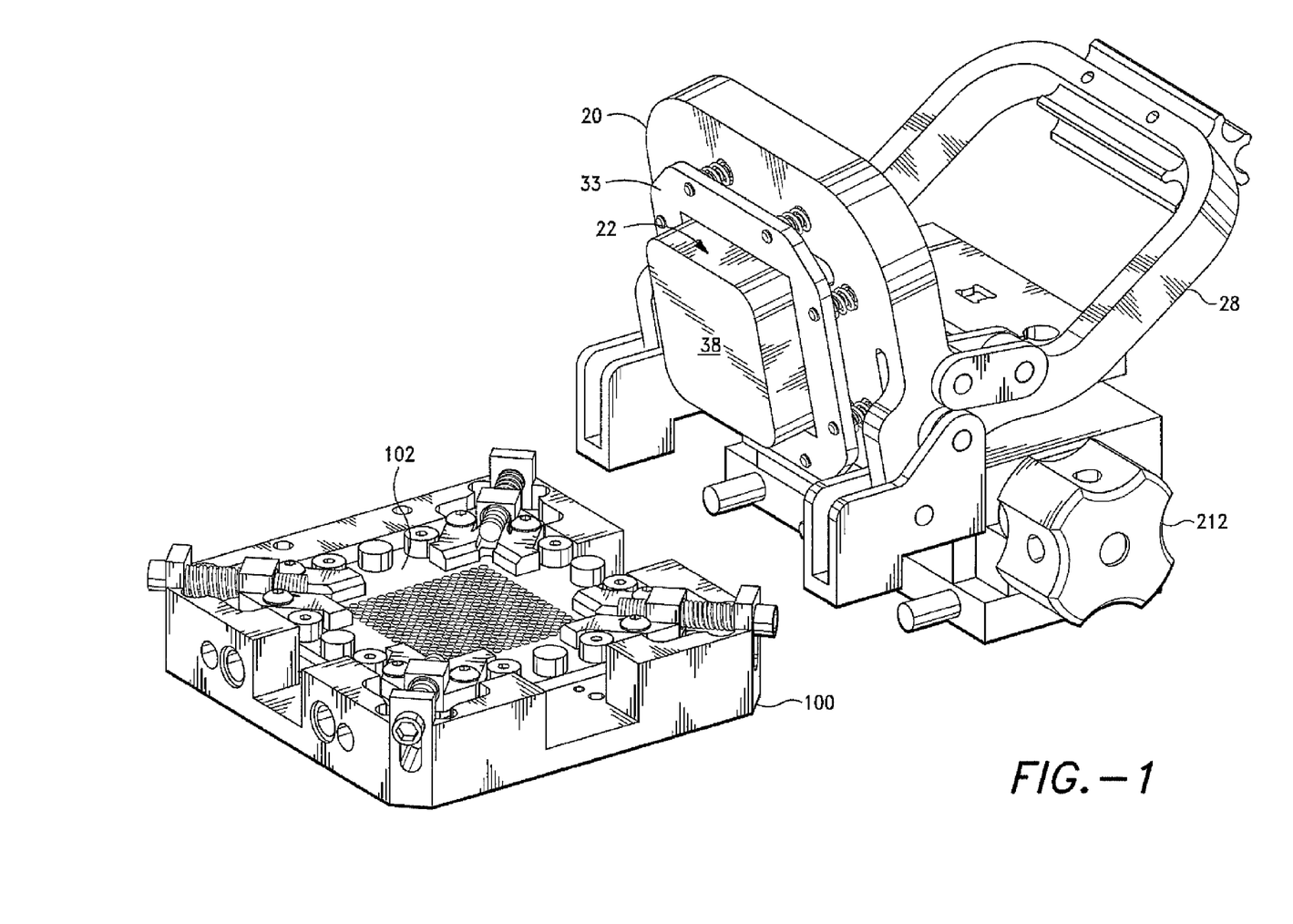
FIG. 1 is a perspective view of the suspension system, adjustment mechanism in operation with a clamping system in accordance with this invention.

The suspension system 20 includes two self locking members 52. The members 52 rides along the hinge member 24 on the shoulder 25 as shown in FIGS. 1, 3 & 4 and has three pivot points, 31, 33, & 35 are pivoted on handle 28 and hinge frame 26 at points 31 and 32 respectively (FIGS. 3 & 4. As the handle 28 moves to the closed position, pivot points, 31, 33, & 35 are aligned. In order to lock the handle, the three pivot points must align. Upon reaching alignment, the handle increases pressure only slightly, approximately 0.005" and the handle 28 is locked in place. In detail, the third pivot point 35 moves slightly upward as the second pivot point 33 moves the necessary distance downward, all in response to the slight movement of the handle 28. In order to release the handle 28 from the locked position, the handle 28 is merely moved toward the release position.

Figure 6:
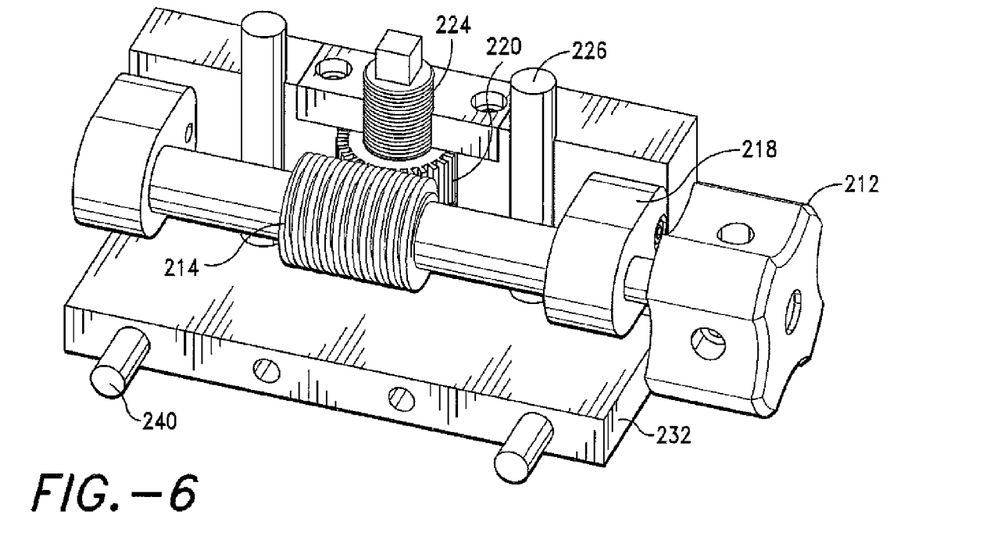
FIGS. 6 and 8 illustrate, in perspective view, one exemplary embodiment of the adjustment mechanism in accordance with this invention.
Figure 7:
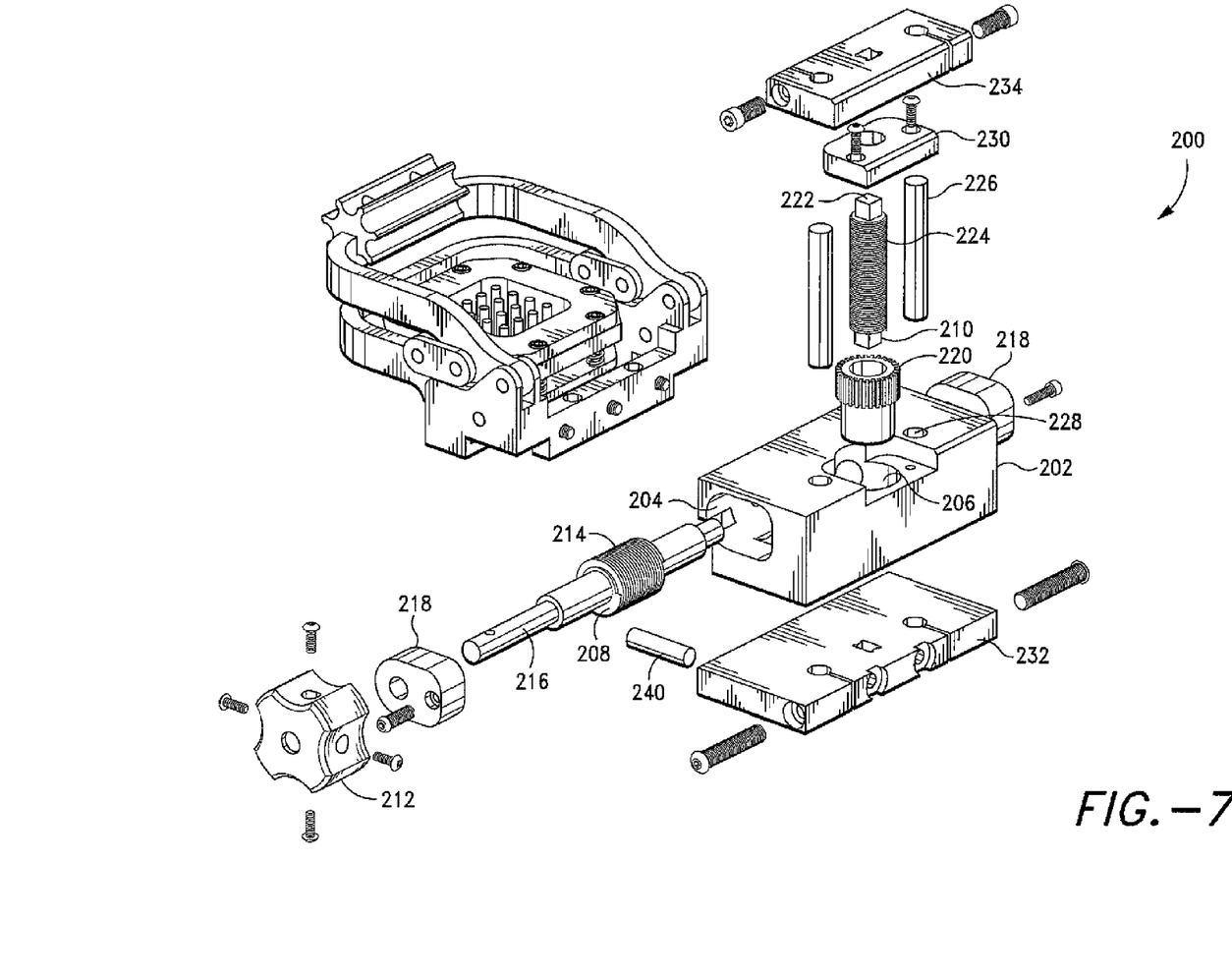
FIG. 7 is an exploded view of the adjustment mechanism in accordance with the invention and disconnected from the suspension system.
Figure 8:
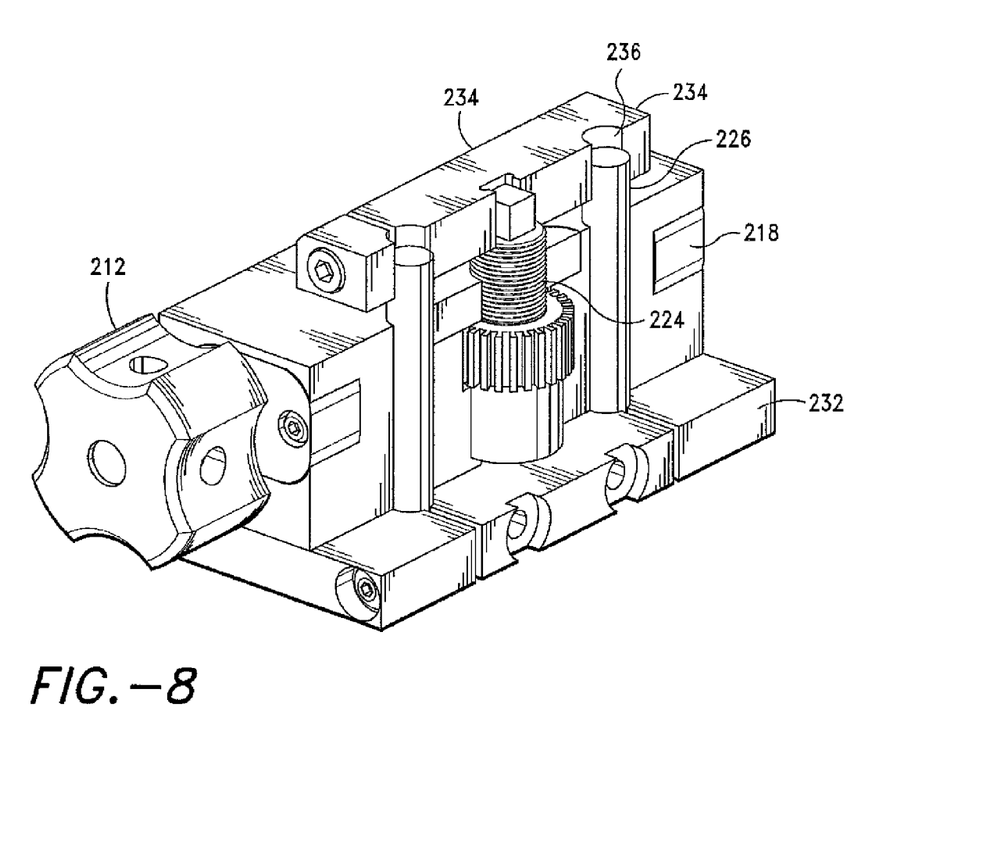

With particular attention to FIGS. 6-8, the adjustment mechanism will now be described in detail. With particular reference to FIG. 7, there is shown the elements of the adjustment mechanism with the mechanism itself generally indicated by the numeral 200. The adjustment mechanism 200 includes a gear housing 202 having an rotational gear opening 204 and a translations gear opening 206. The mechanism 200 includes a rotational gear member 208 and a translational gear member 210, generally perpendicular to one another. The translational gear member 210 translating rotational movement into translational movement orthogonal to the rotational movement. Additionally, the adjustment mechanism 200 includes a control knob 212 connected to the rotational gear member 208.

The rotational gear member 208 comprises a worm gear 214 on an axle 216. The axle 216 is journaled between bearings 218, which are sized and shaped to fit for rotational movement with the axle 216. The housing opening 204 is similarly sized and shaped to receive and hold the bearings 218 therein allowing journaling and free rotation of the axle 216.

Similarly, the translational gear member 210 comprising a primary gear 220, an axle 222 having secondary gear 224. The primary gear 220 engages the worm gear 214. Upon rotation of the control knob 212, the rotational gear moves and the worm gear 214 engages the primary gear 220. The rotational movement is translated into movement orthogonal to the rotational movement. The secondary gear 224 similarly moves in the orthogonal direction.

As the secondary gear 224 moves, the housing 202 responds, moving along the axle 222. In order to facilitate movement of the housing 202, guides 226 are provided in additional openings 228 of the housing 202. The translational gear member 210 is held in place by a locking member 230, which journals the axle 222 in combination with the housing base 232. The top of the axle 222 is fixed by the housing lid 234. Additionally, the lid has openings 236, FIGS. 6 & 8 which journal the guides 226. As a result, the housing moves orthogonally in response to the rotational movement of the control knob 212.

In an alternate embodiment, the housing 202 has internal threads which match and mate with the threads of secondary gear 224. The lid 234 in this embodiment, is then unnecessary. The housing embodiment 202 responds to translational movement along the internal threads thus moving the housing orthogonally with respect to the rotational movement of the control knob 212.

The movement of the housing 202 is limited by the distance and space between the lid 234 and base 232. As will be explained below, the movement of the housing 202 determines whether pressure is applied or released against the IC held by the clamp assembly 100.

The adjustment mechanism 200 includes connection member for connecting the mechanism 200 with the suspension system. In the exemplary embodiment shown in FIGS. 6-8, pins 240 connect to openings in the base 232 and similarly to openings in the suspension system. Thus, as the housing 202 moves, so does the suspension system 20. As the housing 202 is raised, by turning the control knob 212, pressure on the IC is released. Conversely as the control knob 212 is turned in the opposite direction pressure is applied as the housing 202 attached to the suspension system is moved downward.

In Use:

The IC to be tested or otherwise analyzed is placed in the cradle 102 of the clamping assembly 100. In typical situations, the IC will not be in electrical contact at the time of insertion into the cradle.

In an exemplary embodiment, there is no adjustment mechanism. In that embodiment, the suspension system 20 without the aid of the adjustment mechanism stabilizes the IC within the cradle 102 and acts as a shock absorber. The suspension system 20 is mounted over the cradle and held in place and then the handle is closed, bringing the pressure plate 38 downward and applying pressure on the IC. As a result of the spring member 32, even closing the handle 28 fully and completely locking the suspension, too much pressure cannot be applied, damaging the IC. Additionally, the suspension system 20 securely holds the IC in place.

In the embodiment with the adjustment mechanism 200, the suspension system 20 and the mechanism 200 are attached using the connection member 240. The adjustment mechanism 200 easily attaches and detaches without the need for special screws or tools of any kind. Once the suspension system 20 and the adjustment mechanism 200 are connected, the combination is connected to the clamping assembly 100.

Once the combination is connected to the clamping assembly 100, pressure can be applied or released. As the housing 202 moves downward toward the IC, the pressure plate 38 exerts pressure upon the IC. Moving the housing 202 away from the IC clearly has the opposite effect, releasing pressure against the IC.

Thus, two operations are in effect simultaneously occurring when pressure is applied to the IC. First, as discussed above, pressure is applied to the IC and secondarily, the suspension system is lowered making other operations possible.

It should be noted that applying pressure the cradle will be caused to come into contact with electrical pins in the clamping assembly. Once the proper travel distance is achieved optimum electrical contact without damaging the electrical connectors is achieved. Turning the control knob 212 enables the user to easily find the correct travel and cause optimum contact without damaging the IC or the electrical contacts of the clamping assembly.

While the foregoing detailed description has described several embodiments of the device for holding and adjusting an IC in a clamping assembly in accordance with this invention. It is to be understood that the above description is illustrative only and not limiting of the disclosed invention. Particularly, there are various structures which function to hold the IC which are within the spirit and scope of this invention. It will be appreciated the foregoing are but exemplary embodiments and that there are numerous embodiments that are not mentioned but within the scope and spirit of this invention. Thus, the invention is to be limited only by the claims as set forth below.

What is claimed is:

1. A suspension system for an integrated chip (IC) held in a clamp assembly, the suspension system comprising:

a pressure plate, adapted to fit compatibly within the clamp assembly for applying pressure to the IC;

a hinge assembly for applying and releasing pressure to the pressure plate, the hinge assembly having a first open position and a second closed position where pressure is applied;

a spring assembly between the pressure plate and the hinge assembly, the spring assembly having predetermined travel limits; and means for connecting the hinge assembly, the pressure plate and the spring assembly for regulating the pressure between the hinge assembly in the second position, whereby, the hinge assembly applies pressure to the pressure plate in the second position and releases the pressure as it moves toward the first position, and whereby the pressure applied to the IC is regulated preventing the IC from being over pressured and damaged.

2. The suspension system as set forth in claim 1, wherein the hinge assembly includes a hinge member and a hinge frame, the hinge member and the hinge frame being hingeably connected and wherein the hinge frame has a central opening sized and shaped to allow insertion of the pressure plate within the central opening.

3. The suspension system as set forth in claim 2, wherein the pressure plate includes a central portion and a flange, and wherein the interface has a central opening and the pressure plate is sized and shaped to fit and move within the central opening in the interface.

4. The suspension system as set forth in claim 3, wherein the pressure plate is trapped between the interface and the hinge frame such that as the hinge frame moves from the first to the second position, pressure is applied to the pressure plate.

5. The suspension system as set forth in claim 4, wherein the hinge assembly includes a handle member for moving the hinge frame from the first to the second position.

6. The suspension system as set forth in claim 5, wherein the handle member includes a grip.

7. The suspension system as set forth in claim 2, wherein suspension system includes a locking member for locking the hinge assembly into position.

8. The suspension system as set forth in claim 7, wherein the locking member interfaces with the hinge frame and rotates against the hinge frame from a first open position to a second closed position.

9. In combination with a suspension system, an adjustment mechanism for applying pressure to an IC held in a clamping assembly, the adjustment mechanism comprising:

a housing;

a rotational gear member;

a translation gear member engaging the rotational gear member;

a control member connected to the rotational member for moving the rotational gear member; and a connection member for interfacing with the suspension system, and for converting the movement of the control member into applying pressure to the suspension system.

10. The adjustment mechanism as set forth in claim 9, wherein the adjustment mechanism applies and releases pressure to the pressure plate.

11. The adjustment mechanism as set forth in claim 9, wherein the adjustment mechanism housing has an opening for accommodating the gear members, the gear members seated in the housing and free to move within the housing.

12. The adjustment mechanism as set forth in claim 9, wherein the rotational gear member comprises a worm gear on an axle and wherein the housing includes a bearing member for supporting the axle and allowing rotational movement.

13. The adjustment mechanism as set forth in claim 12, wherein the translational gear member includes a compatible worm gear for engaging the rotational member worm gear and a second gear for engaging the connection member and causing the suspension system to apply or release pressure in response to the movement of the second gear.

* * * * *